(12) United States Patent
Lee et al.

(10) Patent No.: US 11,486,729 B2
(45) Date of Patent: Nov. 1, 2022

(54) DATA CONCENTRATION UNIT AND OPERATING METHOD THEREOF

(71) Applicant: Korea Electric Power Corporation, Naju-si (KR)

(72) Inventors: Kang-Se Lee, Naju-si (KR); Hyeong-Ju Lee, Naju-si (KR); Jae-Wan Kim, Naju-si (KR)

(73) Assignee: KOREA ELECTRIC POWER CORPORATION, Naju-si (KR)

( * ) Notice: Subject to any disclaimer, the term of this patent is extended or adjusted under 35 U.S.C. 154(b) by 506 days.

(21) Appl. No.: 16/090,587

(22) PCT Filed: Aug. 11, 2017

(86) PCT No.: PCT/KR2017/008795
§ 371 (c)(1),
(2) Date: Oct. 1, 2018

(87) PCT Pub. No.: WO2018/101576
PCT Pub. Date: Jun. 7, 2018

(65) Prior Publication Data
US 2020/0408565 A1 Dec. 31, 2020

(30) Foreign Application Priority Data
Dec. 1, 2016 (KR) .................. 10-2016-0162942

(51) Int. Cl.
*G01D 4/00* (2006.01)
*G01R 22/06* (2006.01)
*G06F 8/65* (2018.01)

(52) U.S. Cl.
CPC ........... *G01D 4/002* (2013.01); *G01R 22/063* (2013.01); *G06F 8/65* (2013.01); *H04Q 2209/60* (2013.01)

(58) Field of Classification Search
CPC .. H04Q 9/00; H04Q 2209/00; H04Q 2209/10; H04Q 2209/20; H04Q 2209/30;
(Continued)

(56) References Cited

U.S. PATENT DOCUMENTS

| | | | |
|---|---|---|---|
| 5,280,586 A | 1/1994 | Kunz et al. | |
| 7,185,131 B2 * | 2/2007 | Leach | G01D 4/004 710/305 |

(Continued)

FOREIGN PATENT DOCUMENTS

| | | | | |
|---|---|---|---|---|
| KR | 20030054648 A | * | 7/2003 | ............ H04L 12/66 |
| KR | 20030054648 A | | 7/2003 | |

(Continued)

*Primary Examiner* — Franklin D Balseca
(74) *Attorney, Agent, or Firm* — Foundation Law Group, LLP

(57) ABSTRACT

The present invention relates to a data concentration unit and an operating method thereof. To this end, the data concentration unit of the present invention includes: a substrate; and a data communication unit for collecting meter reading data of a plurality of customers through communications with power metering communication modems respectively connected to watt-hour meters provided for the plurality of customers, wherein the data communication unit includes at least one wired communication module for performing wired communication with power metering wired communication modems, and at least one wireless communication module for performing wireless communication with power metering wireless communication modems, and the wired communication module and the wireless communication module are inserted and provided into the substrate.

15 Claims, 10 Drawing Sheets

(58) Field of Classification Search
CPC .......... H04Q 2209/40; H04Q 2209/60; H04Q 2209/70; H04Q 2209/80; H04Q 2209/84; G01D 4/002; G01D 4/004; G01D 4/008; G01R 22/061; G01R 22/063; G06F 8/60; G06F 8/61; G06F 8/65; H04B 2203/5429; H04B 2203/5433; H04B 2203/5441; H04B 3/00; H04B 3/54; H04B 3/542
See application file for complete search history.

(56) References Cited

U.S. PATENT DOCUMENTS

| | | | | |
|---|---|---|---|---|
| 7,543,287 | B2* | 6/2009 | Zimmer | G06F 3/0632 |
| | | | | 712/225 |
| 7,956,767 | B2* | 6/2011 | Ratiu | G01D 4/004 |
| | | | | 340/288 |
| 8,752,039 | B1* | 6/2014 | Bapat | G06F 8/65 |
| | | | | 717/171 |
| 8,957,784 | B2* | 2/2015 | Myoung | H04Q 9/00 |
| | | | | 340/870.03 |
| 9,277,018 | B2* | 3/2016 | Kotecha | H04L 67/18 |
| 10,701,408 | B2* | 6/2020 | Park | H04N 21/64322 |

FOREIGN PATENT DOCUMENTS

| | | |
|---|---|---|
| KR | 101067205 B | 9/2011 |
| KR | 20130013894 A | 2/2013 |
| KR | 20130118642 A | 10/2013 |
| KR | 20160059772 A | 5/2016 |

\* cited by examiner

[P] DCU DEDICATED TO PLC

[Z] DCU DEDICATED TO ZigbeE

[W] DCU DEDICATED TO Wi-SUN

DATA CONCENTRATION UNIT AND OPERATING METHOD THEREOF

TECHNICAL FIELD

The present invention relates to a data concentration unit and an operating method thereof and, more particularly, to a data concentration unit and an operating method thereof, whereby a remote meter reading communication network is constructed and operation and management thereof are efficiently performed, for a whole area on a per-meter reading block basis.

BACKGROUND ART

Remote meter reading refers to the reading of meter reading data, such as electricity, gas, water, watt-hour meter, etc., using a terminal from a remote place without visiting a customer, and a remote meter reading system refers to a system in which the indication of the meter at a remote place and items detected by a detector are automatically collected through a communication line using cable or radio waves and then collected and analyzed by a computer.

Such remote meter reading system (also referred to an advanced metering infrastructure (AMI)) collects information using telephone line, power line, or radio frequency scheme. Also, it is possible to issue bills and determine demand patterns in conjunction with computer programs through the remote meter reading system. The remote meter reading system has been envisioned as a core infrastructure such as demand response (DR), which is a major field of new energy business.

Generally, as shown in FIG. 1, the remote meter reading system includes a watt-hour meter 10 provided for a customer, a data concentration unit 20 provided on a pole or the like for collecting meter reading data from a watt-hour meter 10, and a meter reading server 30 for collecting data from the data concentration device 20.

When configuring a communication network for the data concentration unit 20 and the watt-hour meter 10, the communication network is configured with a wired system (HS-PLC, HPGP) and a wireless system (Zigbee, Wi-SUN, etc.) as shown FIG. 2, in which a data concentration unit 21, 22, or 23 dedicated to each communication network is provided.

However, there is a problem that an incoming network (communication network between a data concentration unit and a watt-hour meter) of the remote meter reading system is inefficiently built, when the incoming network is built in a single communication method as shown in FIG. 3. That is, there is a limitation in building an AMI communication network on a per-block basis, when configuring the incoming network of the remote meter reading system. In addition, in order to apply another incoming network system of the AMI, when a data concentration unit dedicated to the corresponding incoming network is provided (for example, in the case where wireless data concentration unit is added in a situation in which a wired data concentration unit is provided), a communication network is inefficiently built so that delays in building the communication network are caused and redundant investment is incurred, thereby hindering completion in a timely manner. In addition, it is expected that many management issues are likely to occur when undergoing AMI communication equipment management in the future, which results in increasing the maintenance cost for stable operation and management of AMI communication equipment.

Also, though the data concentration unit may accommodate up to 200 households, most data concentration units accommodate only about 20 to 50 households, considering the number of households under a transformer. Given the capacity of the data concentration unit, availability of the data concentration unit is not maximally utilized.

In addition, a conventional data concentration unit has a structure in which it is difficult to add and remove new functions due to development of AMI technology and it is difficult to diagnose faults.

Specifically, the conventional data concentration unit has a stacked structure, whereby there is a problem in which system scalability is poor because of no interface for interworking with other functions. Accordingly, in order to additionally accommodate the communication method according to the AMI technology development and provide additional services such as IoT using the data concentration unit, a separate additional device have to be provided or a dedicated device have to be separately provided. Accordingly, there is a problem that costs increase to accommodate new functions due to advances of technology. In addition, it is difficult to remotely diagnose faults and recover from the fault due to the form of the stacked structure. Since entire substrate has to be replaced when a fault occurs, facility operation and management are inefficient. In addition, considering hardware structure of the conventional data concentration unit, the structure is different from one manufacturer to another, whereby it is expected that there is difficulty in facility operation and management, such as storing and managing spare parts for each maker due to lack of compatibility between manufacturers.

In addition, conventionally, since a software structure of the data concentration unit is operated in such a way that an operating system and an application are interdependent, the operation of the corresponding data concentration unit has to be stopped when performing correction or improvement thereon, whereby there are limitations in remotely modifying or improving the data concentration unit. When there a plurality of applications, it is impossible to correct or improve an application because other applications are affected by the correction or improvement. That is, there is a limitation in defining the range of modification or improvement of one application within a range in which other applications are not affected.

In addition, there are problems that it is difficult to provide information such as an abnormal symptom and an alarm to the parent system in abnormal operation of each application, and thus the conventional apparatus has a structure in which it is difficult to know exact cause when there are abnormalities in the meter reading service and other services and thus is vulnerable to remote management.

DISCLOSURE

Technical Problem

The present invention has been made keeping in mind the above problems, and an object of the present invention is to provide a data concentration unit capable of configuring an AMI communication network, in such away that it is not necessary to provide a separate data concentration unit to configure an incoming network (section between data concentration unit and watt-hour meter) in order to perform inspection on a per-block basis, and accordingly it is not necessary to perform examination on an empty block suitability (electric pole strength) for configuring additional network for an section between data concentration unit-server to provide the separate data concentration unit.

Technical Solution

In order to solve the above-described problems, according to the present invention, there is provided a data concentration unit, the unit including: a substrate; and a data communication unit for collecting meter reading data of a plurality of customers through communications with power metering communication modems respectively connected to watt-hour meters provided for the plurality of customers, wherein the data communication unit includes at least one wired communication module for performing wired communication with power metering wired communication modems, and at least one wireless communication module for performing wireless communication with power metering wireless communication modems; and the wired communication module and the wireless communication module are inserted and provided into the substrate.

Further, the substrate may include a plurality of universal slots, and the wired communication module and the wireless communication module may be inserted into the universal slots and operated.

Further, the wired communication module may include an HS-PLC communication module and an HPGP communication module, and at least one of the HS-PLC communication modules and the HPGP communication module may be selectively inserted into the substrate according to user's setting.

Further, the wireless communication module may include a Zigbee communication module, a WiSUN communication module, and a LoRa communication module, and at least one of the Zigbee communication module, the WiSUN communication module, and the LoRa communication module may be selectively inserted into the substrate according to user's setting.

Further, the data concentration unit according to an embodiment of the present invention may further include a switch module selectively supplying power to communication modules included in the data communication unit in a Power of Ethernet (PoE) method according to input information, in which the switch module is designed in a modular type and inserted into a universal slot of the plurality of universal slots.

Further, the data concentration unit according to an embodiment of the present invention may further include a processing module inserted into the universal slot and operated.

Further, the processing module may execute a software platform including an application layer, a middleware layer, and an operating system layer to collect the meter reading data of the plurality of customers, in which the middleware included in the middleware layer may perform system resource management assigned to at least one application belonging to the application layer.

Further, the middleware may check a communication state between the wired communication module inserted into the substrate and the power metering wired communication modem and a network state between the wireless communication module inserted into the substrate and the power metering wireless communication modem and transmit the check results to a remote meter reading server.

Further, the middleware may store log data for each process executing at least one application and manages the log data.

Further, the middleware may analyze the log data to check the communication state and the network state.

Further, the application layer may include a network management application, and the middleware transmits the check results to an administrator terminal through the network management application.

Further, when the middleware receives a request for operating system upgrade, the middleware may receive an image of an operating system through communication with an external terminal and perform the operating system upgrade on a basis of the image of the operating system.

In order to solve the above-described problems, according to the present invention, there is provided an operating method of a data concentration unit including a substrate; and a data communication unit for collecting meter reading data of a plurality of customers through communications with power metering communication modems respectively connected to watt-hour meters provided for the plurality of customers, the method including: collecting, by a processing module, meter reading data for the plurality of customers from the power metering communication modems, in which the collecting of the meter reading data is performed by allowing the processing module to execute a software platform including an application layer, a middleware layer, and an operating system layer.

Further, a middleware included in the middleware layer may perform system resource management assigned to at least one application belonging to the application layer.

Further, the operating method of the data concentration unit according to an embodiment of the present invention may further include: checking, by the middleware, a communication state between the wired communication module and the power metering wired communication modem and a network state between the wireless communication module and the power metering wireless communication modem; and transmitting, by the middleware, the check results for the communication state and the network state to a remote meter reading server.

Further, the operating method of the data concentration unit according to an embodiment of the present invention may further include: storing and managing log data for each process executing at least one application included in the application layer.

Further, the checking of the communication state between the wired communication module and the power metering wired communication modem and the network state between the wireless communication module and the power metering wireless communication modem may be performed on a basis of the log data.

Further, the application layer may include a network management application, and the method may further include transmitting, by the middleware, the check results to an administrator terminal through the network management application.

Further, the operating method of the data concentration unit according to an embodiment of the present invention may further include: receiving, by the middleware included in the middleware layer, when receiving a request for operating system upgrade, an image of an operating system through communication with an external terminal and performing the operating system upgrade on a basis of the image of the operating system.

Further, the operating method of the data concentration unit according to an embodiment of the present invention may further include: selectively supplying power to the wired communication module and the wireless communication module in a PoE method according to input information, by a switch module designed in a modular type and inserted into the substrate.

Advantageous Effects

According to a data concentrating apparatus and an operating method thereof according to an embodiment of the present invention, there are advantages that the remote meter reading network may be easily constructed and operation and management thereof may be efficiently performed, for a whole area on a per-meter reading (block) basis.

In addition, according to a data concentrating apparatus and an operating method thereof according to an embodiment of the present invention, there is an advantage that, by using a platform structure that enables easily developing a plurality of applications in a 3-Tier structure, it is easy to add new functions and modify or remove the existing functions.

In addition, according to a data concentrating apparatus and an operating method thereof according to an embodiment of the present invention, there is an advantage that a communication facility in the remote meter reading system may be remotely managed, thereby decreasing maintenance cost and improving a rate of meter reading success.

BEST MODE

Figure 1:
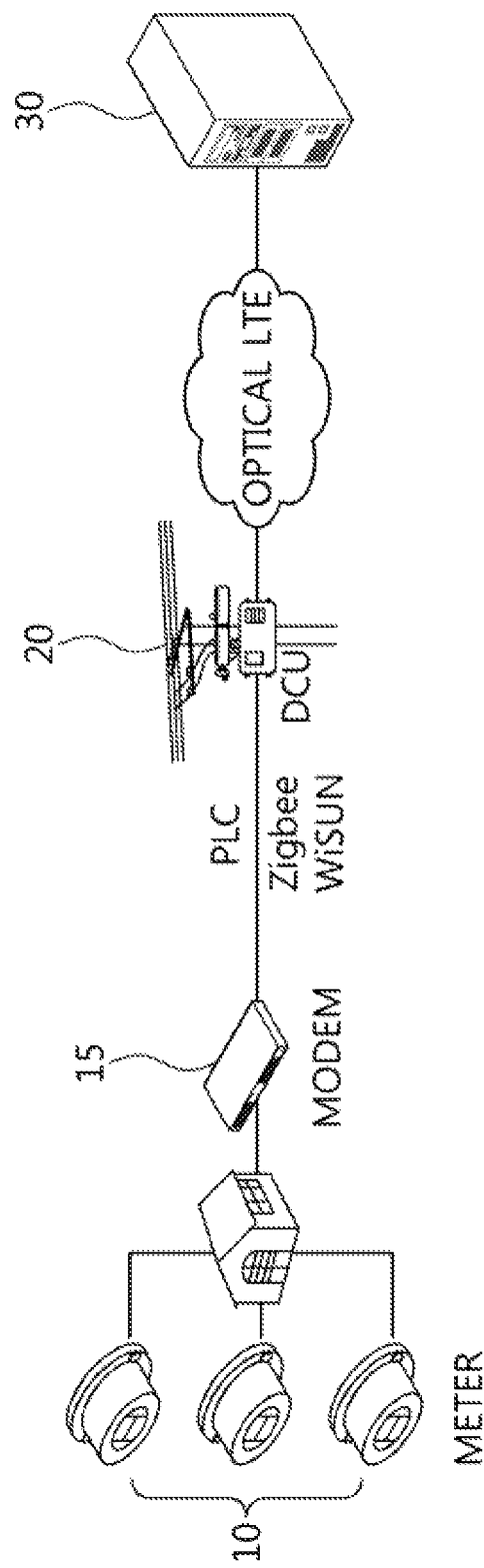
FIG. 1 is a conceptual diagram of a remote meter reading system.
Figure 2:
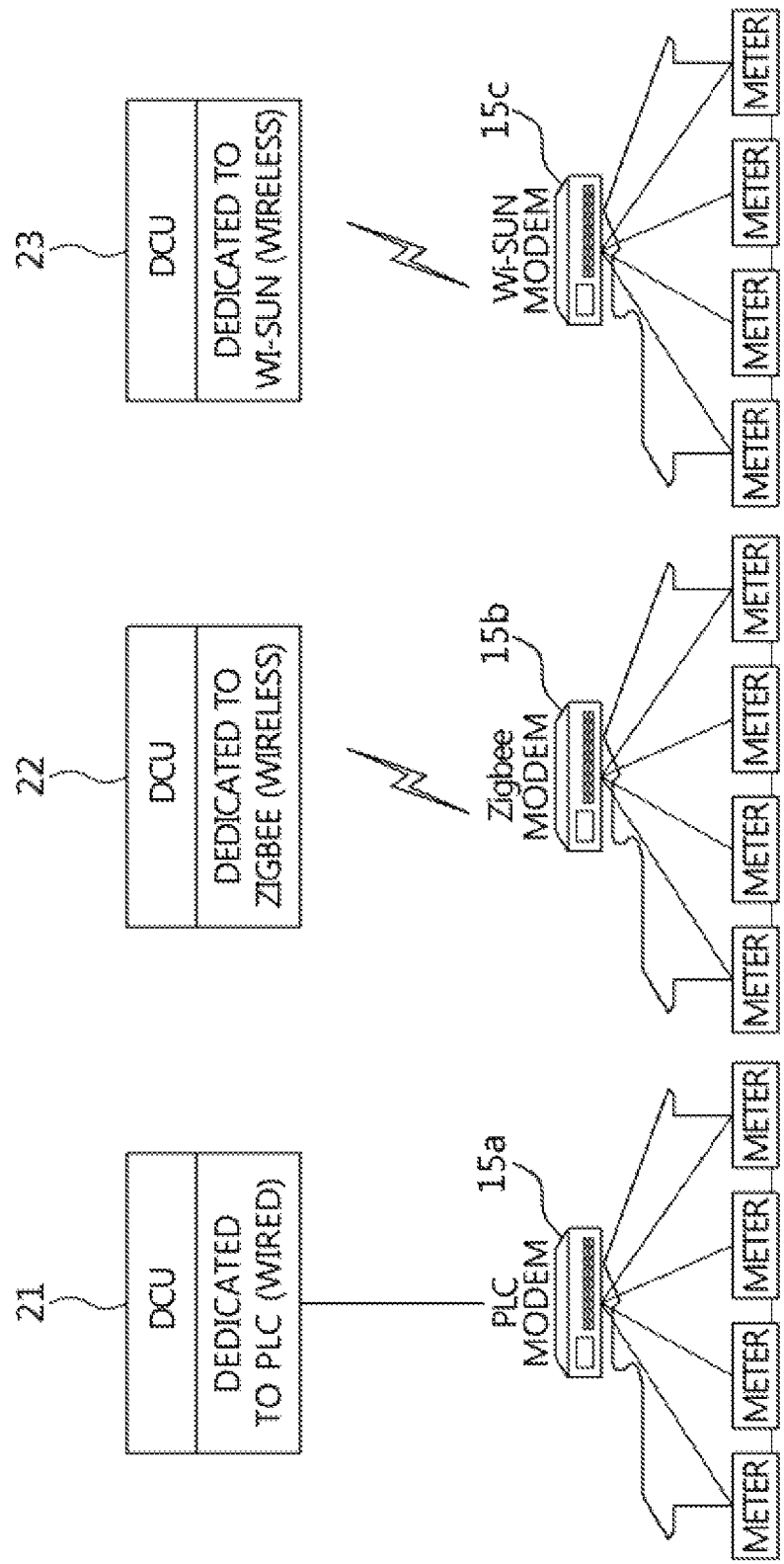
FIG. 2 and FIG. 3 are conceptual diagrams illustrating a data collecting method of a data concentration unit according to the related art.
Figure 3:
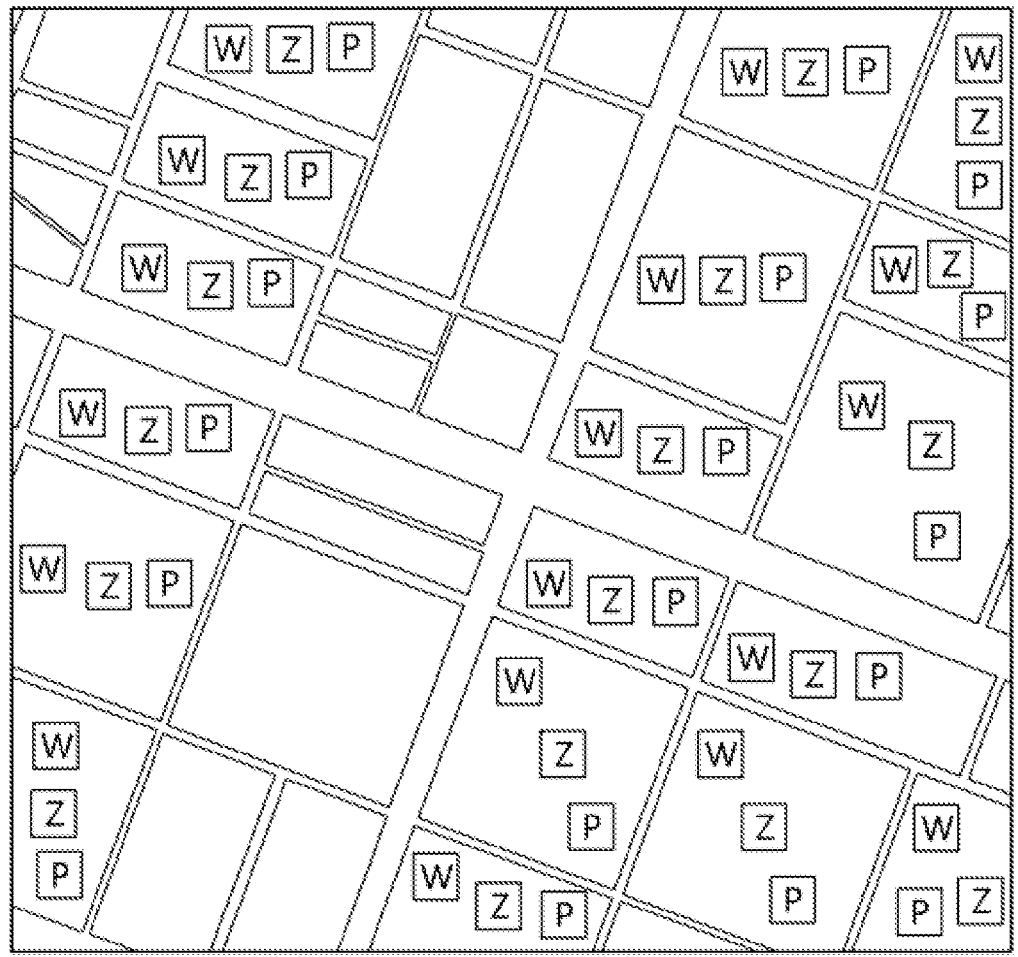

The present invention will now be described in detail with reference to the accompanying drawings. Hereinafter, a repeated description, a known function that may unnecessarily obscure the gist of the present invention, and a detailed description of the configuration will be omitted. Embodiments of the present invention are provided to more fully describe the present invention to those skilled in the art. Accordingly, the shape and size of the elements in the drawings and the like can be exaggerated for clarity.

Hereinafter, a data concentration unit 100 according to an embodiment of the present invention will be described. As described above, a remote meter reading system (i.e., the AMI system) has to be configured in consideration of a flexible structure, improvement of a terminal device, and the like; and a manufacturer has to propose a detailed scheme for components and the configuration thereof. Accordingly, the components included in the remote meter reading system and a parent system (for example, a remote meter reading server, a network management server, a transformer load monitoring server, and a system management server) have to be configured in various flexible structures.

Accordingly, the data concentration unit 100 according to an embodiment of the present invention has an integrated platform structure in which each configuration has a modular structure to have a more flexible structure, thereby solving the problem of hardware non-scalability disclosed as the problem of the related art. Specifically, the data concentration unit 100 according to an embodiment of the present invention may be configured to include a substrate including a plurality of universal slots, and is characterized in that data collection is performed by selectively including necessary modules in the substrate.

Figure 4:
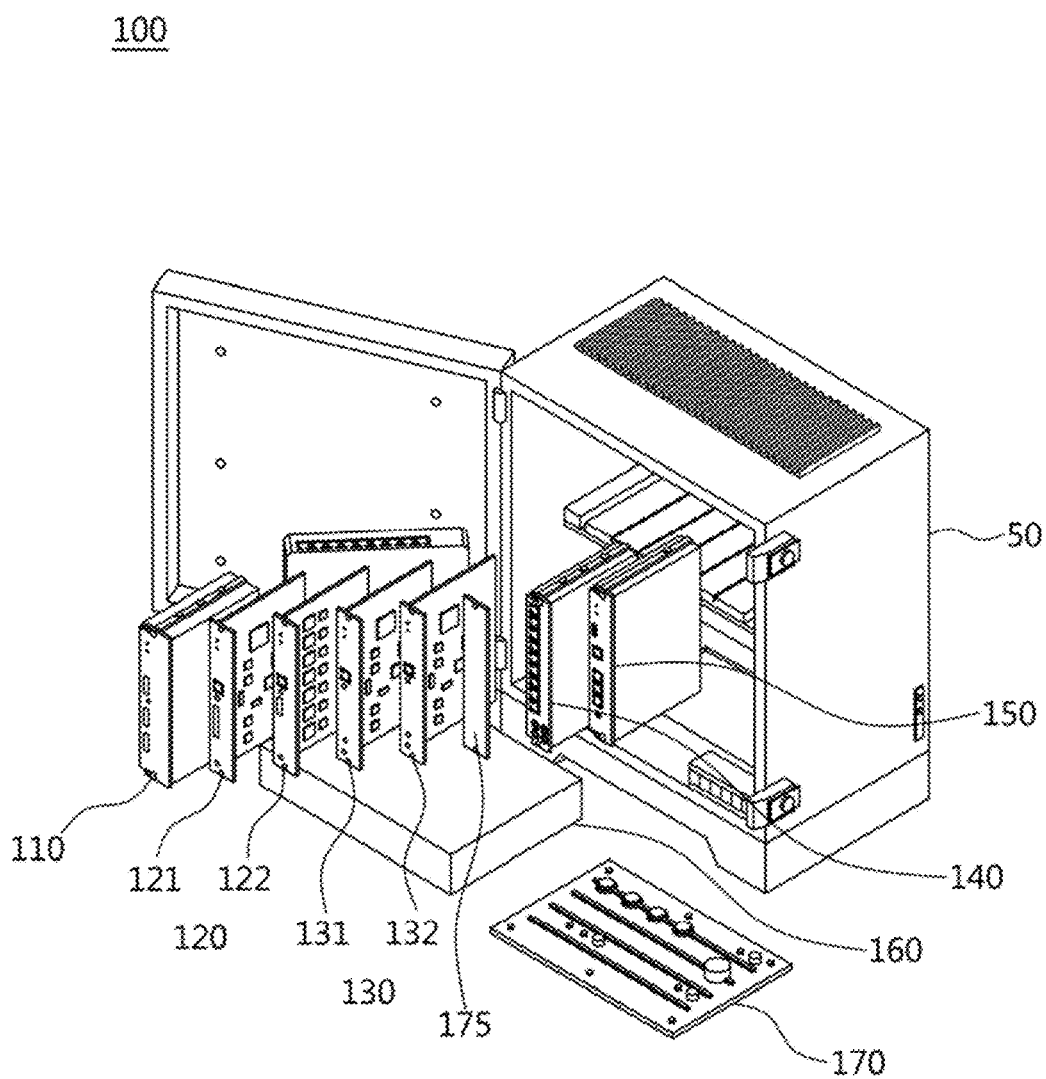
FIG. 4 is a conceptual diagram of a data concentration unit according to an embodiment of the present invention.

For this purpose, the data concentration unit 100 according to an exemplary embodiment of the present invention, as shown in FIG. 4, may be configured to include a substrate, a power management module 110, a wired communication module 120, a wireless communication module 130, a switch module 140, a processing module 150, and an auxiliary power unit 160. The power management module 110, the wired communication module 120, the wireless communication module 130, the switch module 140, and the processing module 150 may be configured in a modular type, as the name thereof suggests, and are inserted into the universal slots included in the substrate and operated. Herein, each module included in the data concentration unit 100 according to an embodiment of the present invention may be attached/detached to/from any slot by applying the universal slot. Also, each module included in the data concentration unit 100 according to an embodiment of the present invention may be provided with a captive screw and a handle to allow the module to be detachable from the front surface of the data concentration unit 100. Now, each configuration included in the data concentration unit 100 according to an embodiment of the present invention will be described.

The power management module 110 receives power from the outside and supplies the power to the data concentration unit 100 according to an embodiment of the present invention.

The data communication units 120 and 130 have a function of collecting meter reading data of a plurality of customers through communication with power metering communication modems respectively connected to the watt-hour meters provided for the customers. Specifically, the data communication units may be divided into a wired communication module and a wireless communication module, and each communication module may be a universal slot type.

Herein, the wired communication module 120 may include, for example, an HS-PLC communication module and an HPGP communication module, and at least one of the HS-PLC communication modules and the HPGP communication module may be selectively inserted into the substrate according to user's setting. In the case of this example, the module 121 is assumed to be an HS-PLC communication module, and the module 122 is assumed to be an HPGP communication module. This is, however, merely an example, and another type of wired communication module may be possibly inserted into a universal slot included in the substrate.

In addition, the wireless communication module 130 may include a Zigbee communication module, a WiSUN communication module, and a LoRa communication module, and at least one of the Zigbee communication module, the WiSUN communication module, and the LoRa communication module may be selectively inserted into the substrate according to user's setting. In the case of this example, the module 131 is assumed to be a Zigbee communication module and the module 132 is assumed to be a WiSUN communication module. This is, however, only an example, and another type of wireless communication module may be possibly inserted into a universal slot included in the substrate.

The switch module 140 has a function of selectively supplying power to a module belonging to a data communication unit on the basis of a PoE (Power of Ethernet) method according to input information. That is, the switch module 140 has a function of selectively operating a plurality of communication modules according to input information even when a plurality of communication modules is inserted into the data concentration unit 100. In addition, since the switch module 140 supplies power on the basis of the PoE method, the communication modules belonging to the data communication unit have an independent structure that does not affect the power of other modules when a module is removed or a problem occurs. This is a distinct feature from the related art having a general bus type structure. The related art requires a back frame that is a separate bus type, whereas the present invention may provide a power supply and communication signal using the standard LI 45 connector. In addition, a failure occurs only in the corresponding module even when an abnormality occurs in a PoE port according to the present invention, whereas there is a problem that occurs in the entire thereof according to the related art.

The switch module 140 may be designed in a modular type similarly to other communication modules belonging to the data communication unit and may be inserted into a universal slot among a plurality of universal slots included in the substrate.

The processing module ISO collects meter reading data using a communication module to which power is applied through the switch module 140, and transmits the collected meter reading data to a remote meter reading server.

The data concentration unit 100 according to an embodiment of the present invention has a plurality of modules inserted into an enclosure 50. In addition, the data concentration unit 100 according to the embodiment of the present invention may apply a Gore-Tex component to the bottom surface (space leading to air flow, and water inflow prevention) in order to prevent condensation due to a temperature difference, and may have a condensate discharge hole design (water inflow prevention by applying waterproofing rubber to the front cover).

Figure 5:
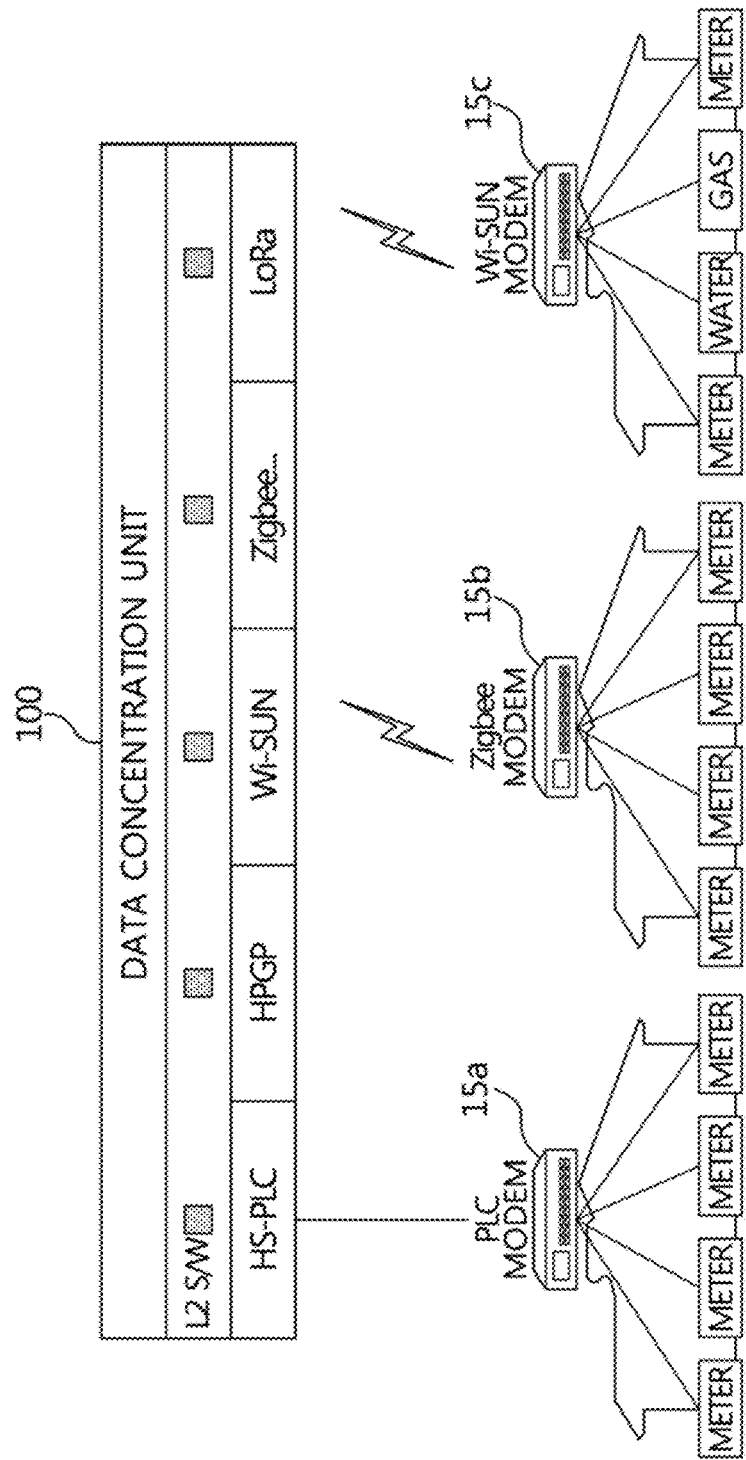
FIG. 5 and FIG. 6 are conceptual diagrams illustrating a data collecting method of a data concentration unit according to an embodiment of the present invention.

In addition, the processing module 150 may perform the meter reading data collection in consideration of a communication type of a communication modem. As shown in FIG. 5, the processing module 150 is controlled to perform communication with a power metering PLC communication modem 15a via a PLC communication module, communication with a power metering Wi-SUN communication module 15b via a Wi-SUN communication module, and communication with a power metering LoRa communication modem 15c via a LoRa communication module.

Figure 6:
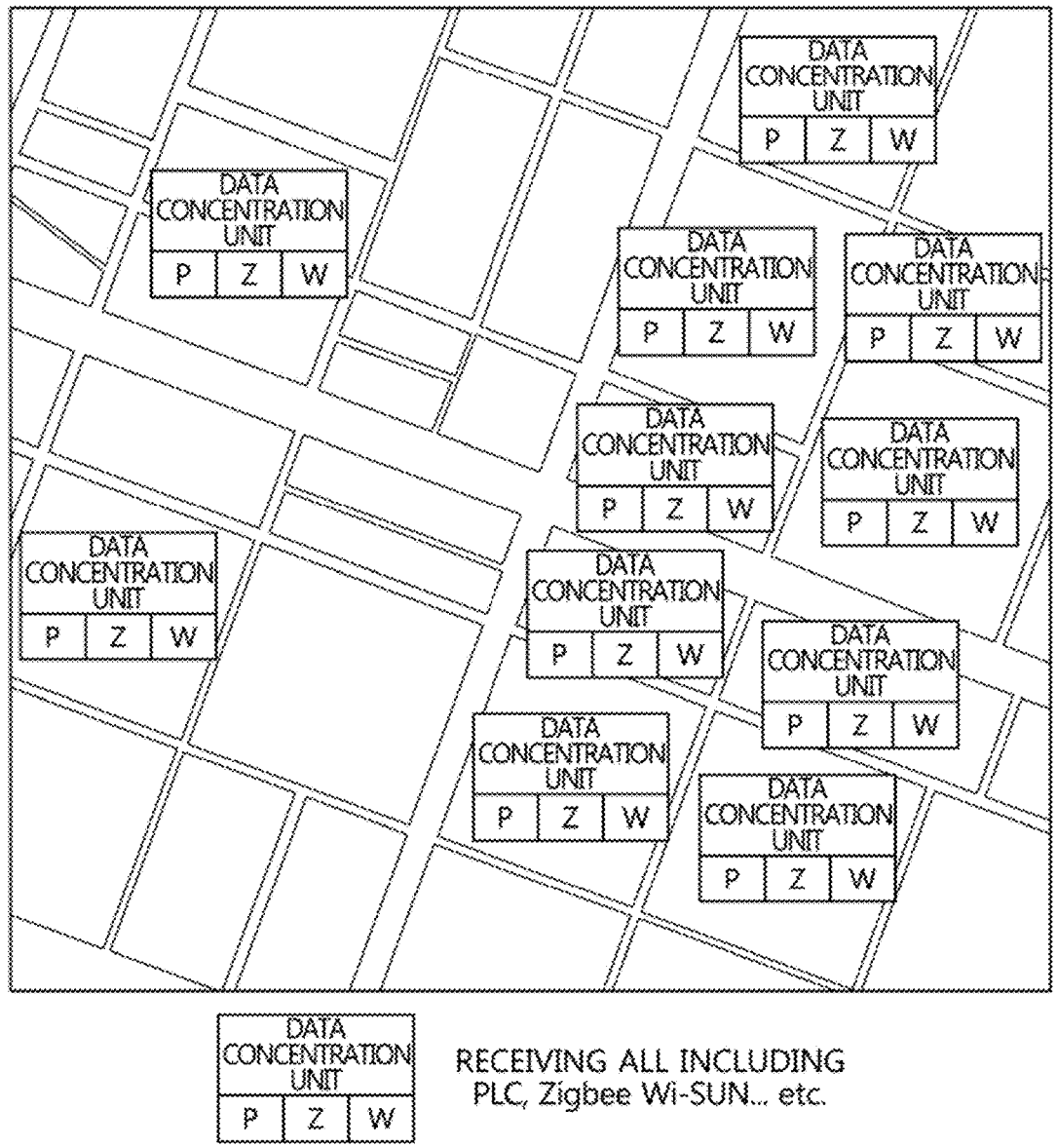

Accordingly, the data concentration unit 100 according to an embodiment of the present invention may support a plurality of communication schemes through one data concentration unit and thus efficiently operated to construct an AMI communication network on a per-block basis as shown in FIG. 6.

As described above, the data concentration unit 100 according to an embodiment of the present invention has the wired communication module 120 and the wireless communication module 130 configured as a modular type structure. Specifically, the data concentration unit 100 according to an embodiment of the present invention is characterized in that each configuration is designed in a modular type in consideration of scalability. Accordingly, when the data concentration unit 100 according to an embodiment of the present invention is applied to a remote meter reading communication network to perform metering on a per-block basis, no additional data concentration unit is required to configure an incoming network (section between data concentration unit and watt-hour meter), compared with the related art.

In addition, according to the data concentration unit 100 according to an embodiment of the present invention, there is no need to review the empty block suitability (electric pole strength) required to construct an additional network for data concentration unit-server section when providing a separate data concentration unit. Also, according to the data concentration unit 100 according to an embodiment of the present invention, a new optical cable and a coaxial cable facility are unnecessary, so that construction period may be shortened and an remote meter reading network may be easily constructed for a whole area on a per-meter reading (block) basis.

That is, the data concentration unit 100 according to an exemplary embodiment of the present invention may implement all of different communication schemes through the wired communication module 120 and the wireless communication module 130 designed in a modular type, in which communication may be performed using a wired (e.g., HS-PLC, HPGP, etc.) and wireless (e.g., Zigbee, WiSUN, LoRa, etc.) as shown in FIGS. 5 and 6. Accordingly, wired/wireless scheme is applied to a data concentration unit in a signal shadow area (signal defective spot) thereby solving the shadow area, a remote meter reading communication network may be constructed on a per-block basis, and a separate dedicated data concentration unit is not required, whereby there are advantages that time is not wasted and investment is not necessary. In addition, on a basis of interfaces (POE, LAN) for providing other additional services except for meter reading service, and interfaces provided as a detachable module type, it is advantageous to have a hardware structure that is easy to provide additional services such as monitoring electric power facilities using object internet sensors, integrating water and gas meter reading, and the like.

Figure 7:
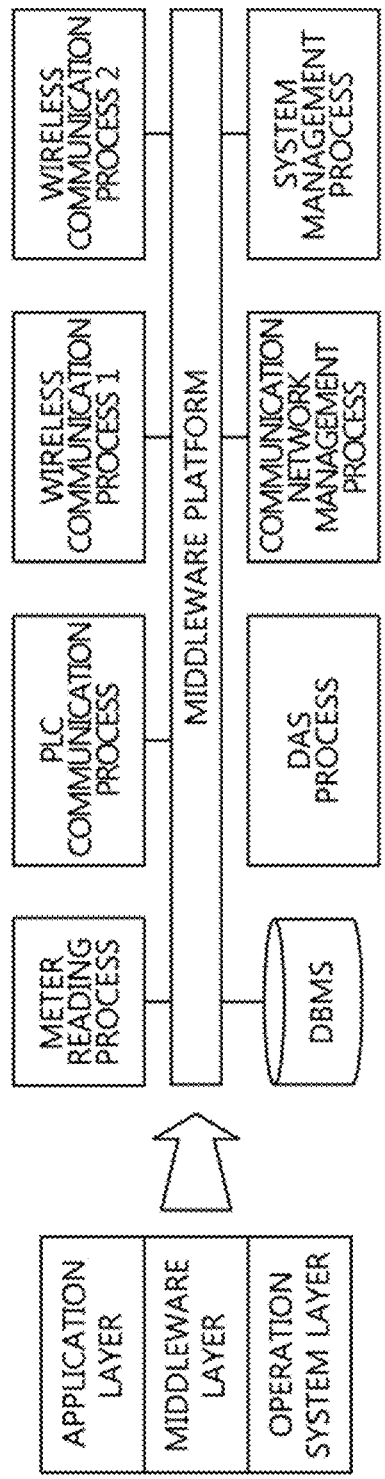
FIGS. 7 to 9 are conceptual diagrams of a software platform executed in a data concentration unit according to an embodiment of the present invention.

Also, in the data concentration unit 100 according to the embodiment of the present invention, the processing module 150 is characterized in ensuring performance quality and stability through an open software platform of a 3-tier structure. Herein, as shown in FIG. 7, the software platform may include three layers, an application layer, a middleware layer, and an operating system layer. That is, the data concentration unit 100 according to an embodiment of the present invention is characterized in implementing various functions utilizing the middleware layer.

That is, in the case of the S/W structure and technology of a DCU device according to the related art, it is necessary to modify and supplement the existing meter reading application as well as even an operating system in order to add an application other than the meter reading function. In addition, the related art has a limitation in additional applications for other services. This is because the operating system and the meter reading application are organically coupled to each other in a 1-Tier structure. Therefore, according to the related art, modifying and supplementing the operating system, which is based on the software, may have physical limitations such as system shut-down, metering service interruption, long development period, and the like.

On the other hand, the processing module 150 according to an embodiment of the present invention is characterized in resolving the above-described problem through a middleware-based software platform. Herein, the middleware serves as a buffer that connects the operating system and the application in the equipment with simplifying various complexities. In other words, middleware performs a function of connecting components of complex systems to each other.

In order to transmit the corresponding data to a parent system through applications (meter reading, transformer monitoring, and power sensor information), and to allocate resources for access to system (OS to CPU, memory, Database, etc.), it is possible to utilize the system resources by separately performing control and setting for access to system for each application. Accordingly, when a new application is added in addition to the existing application, the middleware may allocate the system resource according to importance of each application or each process that executes the application.

Figure 8:
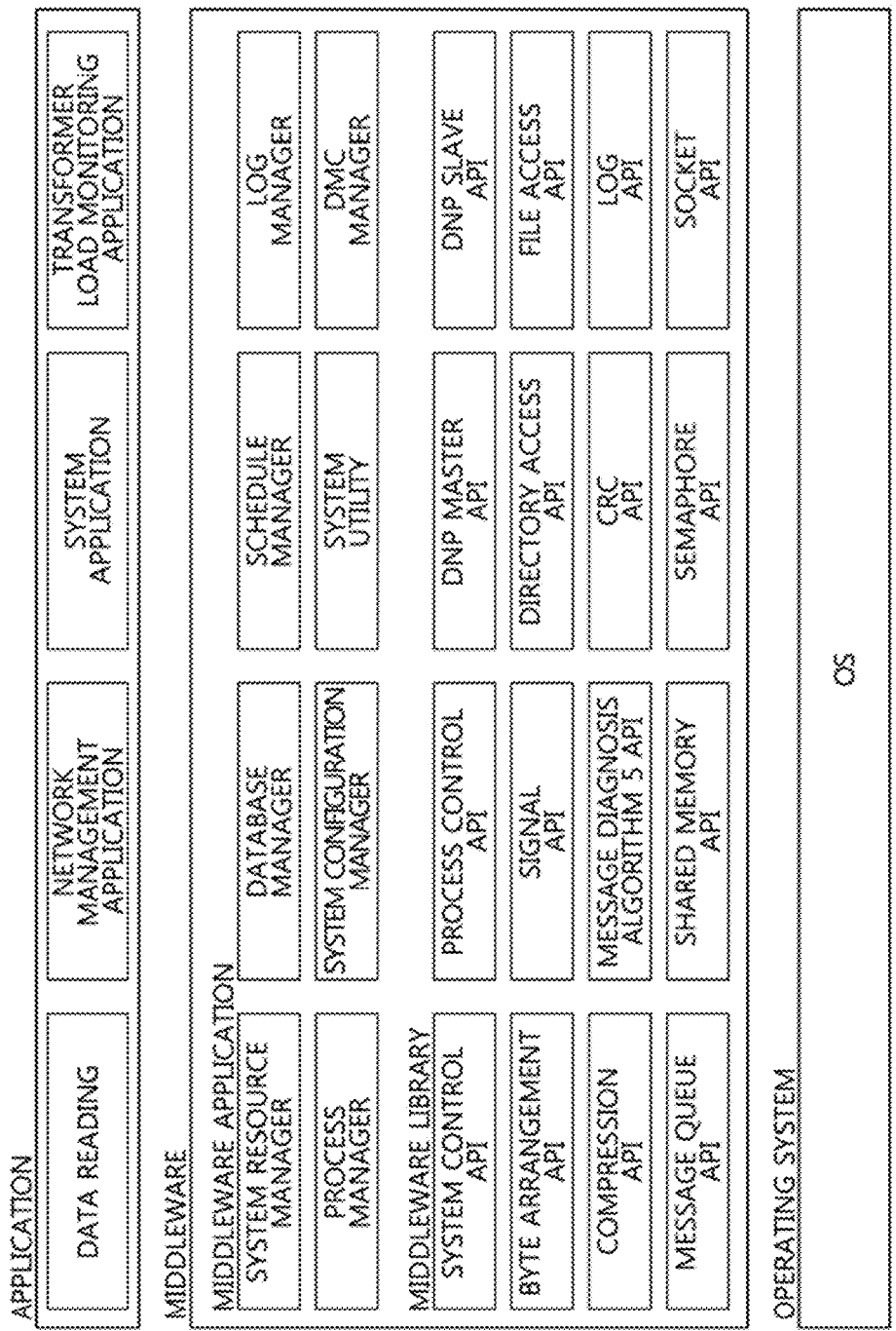
Figure 9:
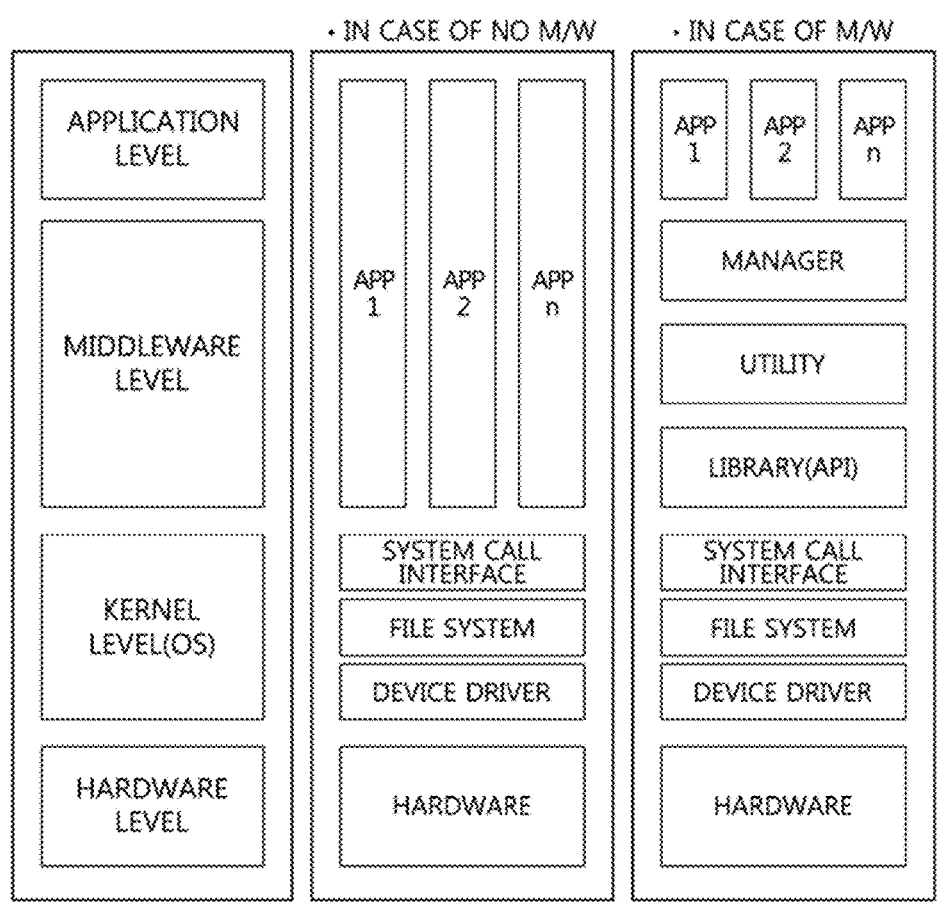

To this end, a software platform according to an embodiment of the present invention may include an application layer, an operating system layer, and a middleware layer as shown in FIGS. 8 and 9, in which the middleware layer may include a middleware application and a middleware library. The data processing apparatus 100 according to an embodiment of the present invention may implement the following functions using the middleware.

First, the data processing apparatus 100 according to an embodiment of the present invention may perform a data metering process described above through the middleware. Specifically, the data processing apparatus 100 according to an exemplary embodiment of the present invention may collect meter reading data for the customer by executing a data meter reading application included in the application layer through the middleware.

In addition, the data processing apparatus 100 according to an embodiment of the present invention may perform a log-related function for each application or for each process that executes an application through the middleware. Specifically, the middleware may perform functions of storing log data for each process executing at least one application and managing the log data.

Also, the middleware may check a communication state and a network state using the log data generated in the process of collecting the meter reading data for the customer. As described above, the data concentration unit 100 according to an embodiment of the present invention may include a plurality of communication module (e.g., wired communication modules and wireless communication modules) designed in a modular type, thereby collecting meter reading data regardless of types of communication modems provided for the customer. Herein, when there is a failure history in the process of collecting the meter reading data, it may be determined that there is a problem in the wired communication state or the wireless network state.

Accordingly, the middleware may check a communication state between the wired communication module inserted into the substrate and the power metering wired communication modem, and a network state between the wireless communication module inserted into the substrate and the power metering wireless communication modem. When the communication state and the network state are checked, the middleware may transmit the check result to the parent system (for example, the remote meter reading server, the network management server, the transformer load monitoring server, and the system management server).

In addition, the application layer may include a network management application. Accordingly, the middleware performs network management through the network management application and also transmits the check result to the manager terminal.

In addition, the middleware collects transformer monitoring setting information and performs transformer load monitoring and power failure monitoring, through transformer load monitoring application.

Also, the middleware may diagnose an operating state of the system using the system management application, acquire information on the system error, modem communication error, and the like, and transmit the resulting information to a parent server. For example, in the data concentration unit 100 according to an exemplary embodiment of the present invention, a memory such as an SD card may be provided. The middleware may provide a security management tool and an agent for the memory using the system management application and diagnose the state of the modules inserted into the data concentration unit 100 (if necessary, perform a power reset function).

In addition, a situation may arise where an operating system upgrade has to be performed remotely. When the middleware receives a request for the operating system upgrade, the middleware receives an image of the operating system through communication with the parent system (for example, a remote meter reading server) or the external terminal (for example, a worker terminal of a worker at the site) and performs the operating system upgrade on a basis of the image of the operating system.

In addition, the middleware may support sockets, data transmission/reception, data compression/decompression, data validation check, blocking/non-blocking communication method, and TCP/IP communication method by providing a server communication API, and perform high speed data processing between processes through SCS.

In addition, the middleware may perform database management, for example to provide DB access function and MMDB standard SQL API and support DB backup and recovery function.

As described above, the data concentration unit 100 according to an embodiment of the present invention is characterized by executing a software platform through a 3-Tier structure. In this case, since the middleware acts as a buffer for adding/deleting new functions to modify the operating system area and add/delete new functions, there is an advantage that the device may be operated stably without system shut-down and meter reading service interruption caused due to modification of the operating system and adding/removing of new functions, which was described above as problems of the related art. In addition, the middleware also has the following advantages.

1) Standardization: Easy access to all equipment or applications in the same standardized way.

2) Simplicity: Even if an operator is not familiar with the specification or interface method, he or she may create a structure that may be easily connected to any equipment or any application.

3) Persistence: Depending on a hierarchical structure of the middleware, the data may be kept for a period of time and, if necessary, may be provided to external applications.

4) Scalability: It is possible to operate and manage (upgrade, add, and delete) software stably and continuously because the software may be easily processed without adding any risk to the whole system even when system or business process is added or changed.

Thus, the present invention has the advantages described above and can be differentiated from the related art as summarized in Table 1 below.

TABLE 1

|  | Related art | Present Invention |
|---|---|---|
| Maintenance | Limitation in providing equipment state information (difficulty) monitoring only normal/abnormal for current communication state insufficient remote management due to impossibility of monitoring for each module impossible to determine failure section → depending on operator's experience | Easy to provide state information for each module (easy management) remote management thanks to communication state and management for each module easy to determine failure section → taking action against system failure irrelevant to operator's experience |
| Scalability | Shortage of interface for providing additional service necessary separate devices (H/W development) artificial change of H/W and S/W structures long period to develop additional services | Supporting interface for providing additional service unnecessary separate devices (module insertion) unnecessary artificial change of H/W structure thanks to modular type shortened development period thanks to S/W of 3-Tier structure |
| Quality Management | No compatibility between manufactures differences between manufactures of H/W, S/W difficulties in vulnerability analysis and taking actions in a collective manner concern on quality decrease due to competition between manufactures | Management easiness thanks to compatibility between manufactures possible to perform persistent update and periodic vulnerability analysis thanks to quality management of S/W with 3-Tier structure H/W quality enforcement based on S/W with 3-Tier structure |

Furthermore, it has been mentioned above that the present invention relates to a data concentration unit. The data concentration unit is, however, only an example and may perform various functions in addition to the function of a general data concentration unit, which results that a name thereof is possibly changed into various names, such as an AMI gateway.

Figure 10:
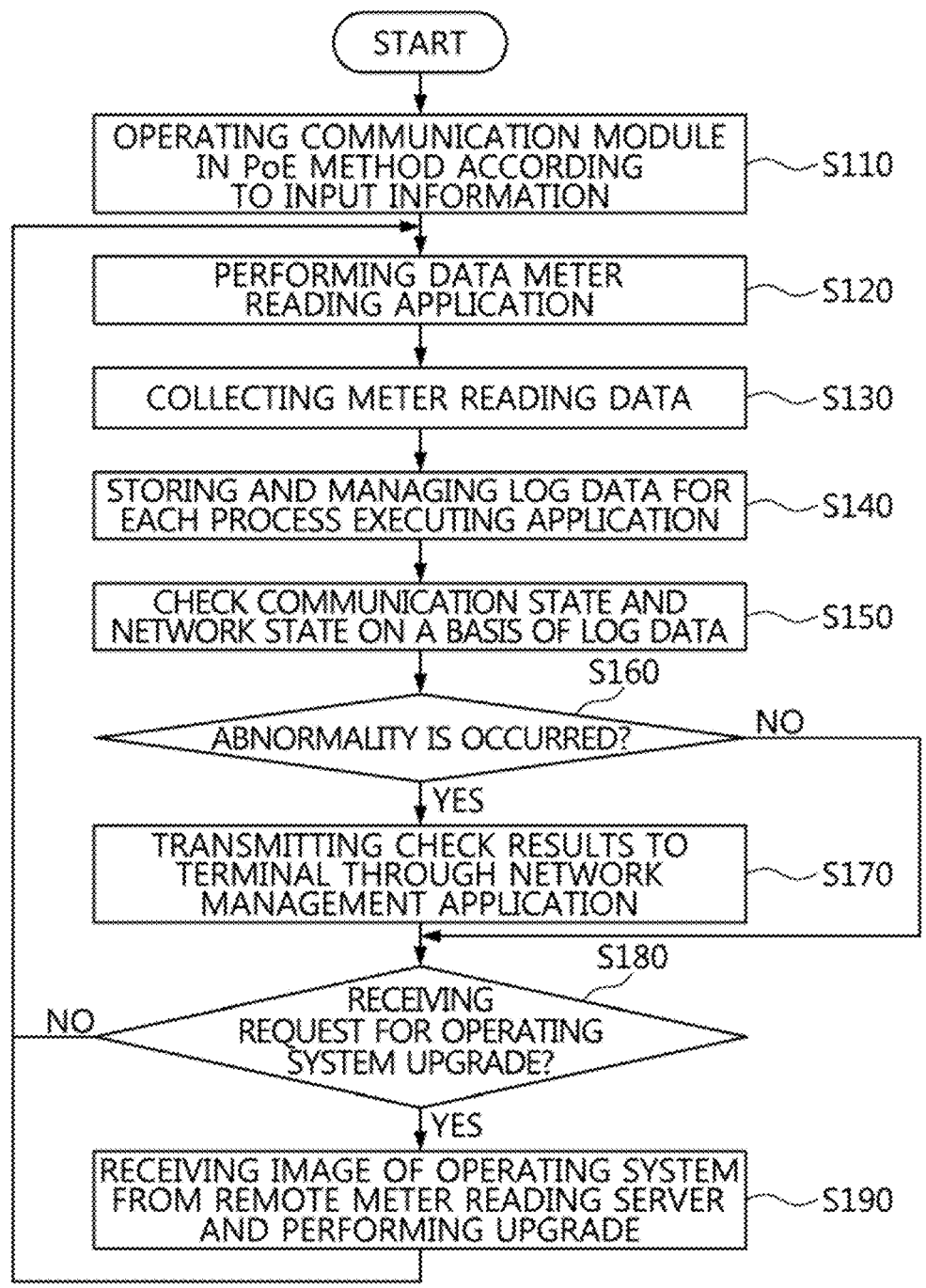
FIG. 10 is a flowchart illustrating an operating method of a data concentration unit according to an embodiment of the present invention.

FIG. 10 is a flowchart illustrating an operating method of a data concentration unit according to an embodiment of the present invention. As described above, the data concentration unit according to an embodiment of the present invention is characterized in that an internal structure thereof is designed in a modular type in consideration of scalability, and meter reading data is collected from a watt-hour meter provided for a customer through each communication module. In addition, the data concentration unit according to an embodiment of the present invention is characterized in that an operation thereof is performed by executing a software platform having a 3-Tier structure (application layer, middleware layer, and operating system layer). Referring now to FIG. 10, an operating method of a data concentration unit according to an embodiment of the present invention will be described. Further, in the following description, the description overlapped with the described above will be omitted.

In step S110, power is supplied selectively to a wired communication module and a wireless communication module in a PoE method according to input information, by a switch module designed in a modular type and inserted into the substrate.

In step S120, a data meter reading application included in the application layer is performed through the control of the middleware, by a processing module. In step S130, meter reading data for a plurality of customers are collected from the power metering communication modems, by the processing module. As described above, the processing module may execute a software platform including an application layer, a middleware layer, and an operating system layer.

Thus, the collection of meter reading data through the data concentration unit may be performed through control of the middleware. The middleware may further perform not only the control for collecting meter reading data, but also additional functions mentioned below.

In step S140, log data is stored and managed for each process executing at least one application included in the application layer. That is, the step S140 is a step of storing and managing the log data for each process caused when executing the data reading application in the step S120 and executing applications through the data concentration unit.

In step S150, the log data is analyzed to check a communication state between the wired communication module and a power metering wired communication modem, and a network state between the wireless communication module and a power metering wireless communication modem. Here, the step S150 may be performed by executing the network management application included in the application layer by the processing module. Hereinafter, the check result may then be communicated to the parent system (e.g., remote meter reading server, network management server, etc.).

In step S160, it is determined whether an abnormality has occurred in the communication state or the network state. As a result of the determination in step S160, if it is determined that an abnormality has occurred, the control is moved to step S170 in which the check result is transmitted to an administrator terminal through the network management application.

In addition, a situation may arise where an operating system upgrade have to be performed remotely. Accordingly, a step of checking whether a request for the operating system upgrade is received is performed by the middleware in step S180. As a result of determination in the step S180, when it is determined that the request for the operating system upgrade has been received, the control is moved to step S190 in which an image of the operating system is received through communication with the external system (for example, an external meter reading server) or an external terminal (for example, operator's terminal in the site), and perform the operating system upgrade based on the image of the operating system.

In addition, the steps S140 through S190 are separately classified to facilitate the understanding of the present invention, and the processes do not necessarily have to be sequentially performed. In addition, although not shown in the drawing, the operating method of the data concentration unit according to an embodiment of the present invention includes various functions performed by the middleware, for example, a resource management function, a DB management function, a communication service support function, a system state management function, and the like for application-executing processes, and descriptions thereof were described in detail above, so that redundant description is omitted.

As described above, an optimal embodiment has been disclosed in the drawings and specification. Although specific terms have been used herein, they are used for purposes of illustration only and are not intended to limit the scope of the invention as defined in the claims. Therefore, it will be understood by those skilled in the art that various changes and modifications may be made without departing from the scope of the present invention. Accordingly, the true scope of the present invention should be determined by the technical idea of the appended claims.

The invention claimed is:

1. A data concentration unit, the unit comprising:
a substrate, wherein the substrate includes a plurality of universal slots, and a wired communication module and a wireless communication module are inserted into the universal slots and operated;
a data communication unit for collecting meter reading data of a plurality of customers through communications with power metering communication modems respectively connected to watt-hour meters provided for the plurality of customers; and
a switch module selectively supplying power to communication modules included in the data communication unit in a Power of Ethernet (PoE) method according to input information, in which the switch module is designed in a modular type and inserted into a universal slot of the plurality of universal slots
wherein the data communication unit includes the wired communication module for performing wired communication with power metering wired communication modems, and the wireless communication module for performing wireless communication with power metering wireless communication modems; and
the wired communication module and the wireless communication module are inserted and provided into the substrate.

2. The data concentration unit according to claim 1, wherein the wired communication module includes an HS-PLC communication module and an HPGP communication module, and at least one of the HS-PLC communication module and the HPGP communication module is selectively inserted into the substrate according to user's setting.

3. The data concentration unit according to claim 1, wherein the wireless communication module includes a Zigbee communication module, a WiSUN communication module, and a LoRa communication module, and at least one of the Zigbee communication module, the WiSUN communication module, and the LoRa communication module is selectively inserted into the substrate according to user's setting.

4. The data concentration unit according to claim 1, further comprising a processing module inserted into a universal slot of universal slots and operated.

5. The data concentration unit according to claim 4, wherein the processing module executes a software platform including an application layer, a middleware layer, and an operating system layer to collect the meter reading data of the plurality of customers, in which a middleware included in the middleware layer performs system resource management assigned to at least one application belonging to the application layer.

6. The data concentration unit according to claim 5, wherein the middleware checks a communication state between the wired communication module inserted into the substrate and the power metering wired communication modems and a network state between the wireless communication module inserted into the substrate and one the power metering wireless communication modems and transmits check results to a remote meter reading server.

7. The data concentration unit according to claim 6, wherein the middleware stores log data for each process executing at least one application and manages the log data of each of the processes.

8. The data concentration unit according to claim 7, wherein the middleware analyzes the log data of each of the processes to check the communication state and the network state.

9. The data concentration unit according to claim 6, wherein the application layer includes a network management application, and the middleware transmits the check results to an administrator terminal through the network management application.

10. The data concentration unit according to claim 5, wherein, when the middleware receives a request for operating system upgrade, the middleware receives an image of an operating system through communication with an external terminal and performs the operating system upgrade on a basis of the image of the operating system.

11. An operating method of a data concentration unit including a substrate; and a data communication unit for collecting meter reading data of a plurality of customers through communications with power metering communication modems respectively connected to watt-hour meters provided for the plurality of customers, the method comprising:
collecting, by a processing module, the meter reading data for the plurality of customers from the power metering communication modems, in which the collecting of the meter reading data is performed by allowing the processing module to execute a software platform including an application layer, a middleware layer, wherein a middleware included in the middleware layer performs system resource management assigned to at least one application belonging to the application layer, and an operating system layer,
checking, by the middleware, a communication state between a wired communication module and a power metering wired communication modem and a network state between a wireless communication module and a power metering wireless communication modem;

transmitting, by the middleware, check results for the communication state and the network state to a remote meter reading server; and selectively supplying power to the wired communication module and the wireless communication module in a PoE method according to input information, by a switch module designed in a modular type and inserted into the substrate.

12. The method according to claim 11, further comprising: storing and managing log data for each process executing at least one application included in the application layer.

13. The method according to claim 12, wherein the checking of the communication state between the wired communication module and the power metering wired communication modem and the network state between the wireless communication module and the power metering wireless communication modem is performed on a basis of the log data of each of the processes.

14. The method according to claim 11, wherein the application layer includes a network management application, and the method further includes transmitting, by the middleware, the check results for the communication state and the network state to an administrator terminal through the network management application.

15. The method according to claim 11, further comprising: receiving, by the middleware included in the middleware layer, when receiving a request for operating system upgrade, an image of an operating system through communication with an external terminal and performing the operating system upgrade on a basis of the image of the operating system.

* * * * *